(12) United States Patent
Yoshida

(10) Patent No.: US 7,842,608 B2
(45) Date of Patent: Nov. 30, 2010

(54) METHOD FOR MANUFACTURING SEMICONDUCTOR DEVICE HAVING VIA PLUG

(75) Inventor: Kazuyoshi Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 144 days.

(21) Appl. No.: 12/192,349

(22) Filed: Aug. 15, 2008

(65) Prior Publication Data

US 2009/0047779 A1 Feb. 19, 2009

(30) Foreign Application Priority Data

Aug. 15, 2007 (JP) ............................. 2007-211722

(51) Int. Cl.
*H01L 21/4763* (2006.01)
(52) U.S. Cl. ...................... 438/637; 438/618; 438/622; 257/E21.495
(58) Field of Classification Search ................. 438/637, 438/618, 622; 257/E21.495
See application file for complete search history.

(56) References Cited

U.S. PATENT DOCUMENTS

| 6,316,816 | B1 * | 11/2001 | Matsumoto | 257/538 |
| 6,329,241 | B1 * | 12/2001 | Lin | 438/253 |
| 2001/0046737 | A1 * | 11/2001 | Ahn et al. | 438/253 |
| 2001/0051386 | A1 * | 12/2001 | De Laat et al. | 438/48 |
| 2004/0106297 | A1 * | 6/2004 | Kanegae et al. | 438/725 |
| 2006/0097390 | A1 * | 5/2006 | Nam et al. | 257/734 |
| 2006/0211238 | A1 * | 9/2006 | Fujimoto | 438/637 |
| 2007/0077774 | A1 * | 4/2007 | Yoshida | 438/758 |

FOREIGN PATENT DOCUMENTS

| JP | 7-235541 | 5/1995 |
| JP | 10-335450 | 12/1998 |

* cited by examiner

*Primary Examiner*—Thanh V Pham
*Assistant Examiner*—Duy T Nguyen
(74) *Attorney, Agent, or Firm*—Young & Thompson

(57) ABSTRACT

A method for manufacturing a semiconductor device, including: forming a first conductive layer on a first insulating film; forming a second insulating film so as to cover the first conductive layer; forming a resist mask on the second insulating film; forming a hole reaching the first conductive layer in the second insulating film by a first etching using the resist mask; removing the resist mask; removing the first conductive layer exposed at the bottom of the hole by a second etching, so that the hole reaches the first insulating film and the first conductive layer exposes at a side surface within the hole; forming a conductive plug in contact with the first conductive layer exposed at the side surface within the hole by burying a conductive material in the hole; and forming a second conductive layer to be connected to the conductive plug on the second insulating film.

6 Claims, 12 Drawing Sheets

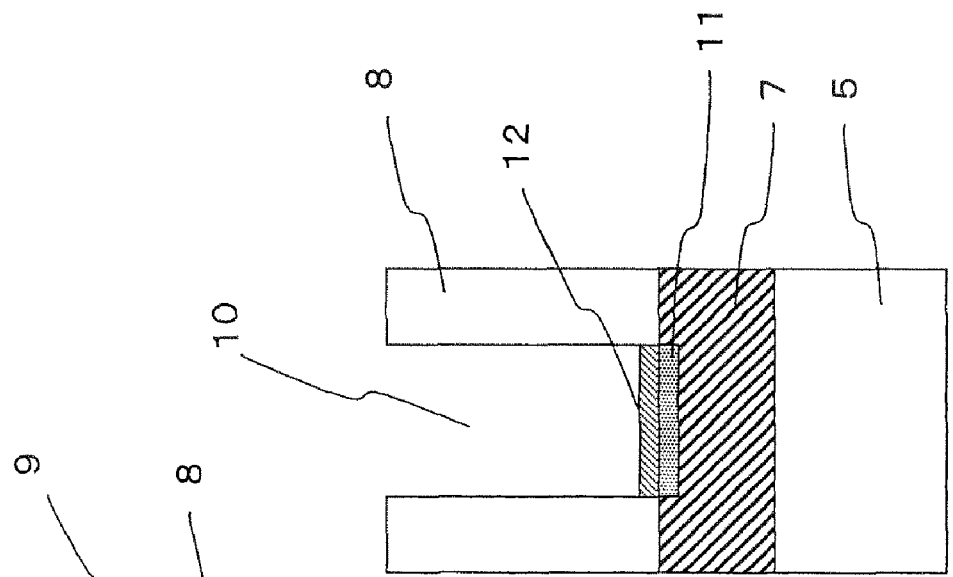
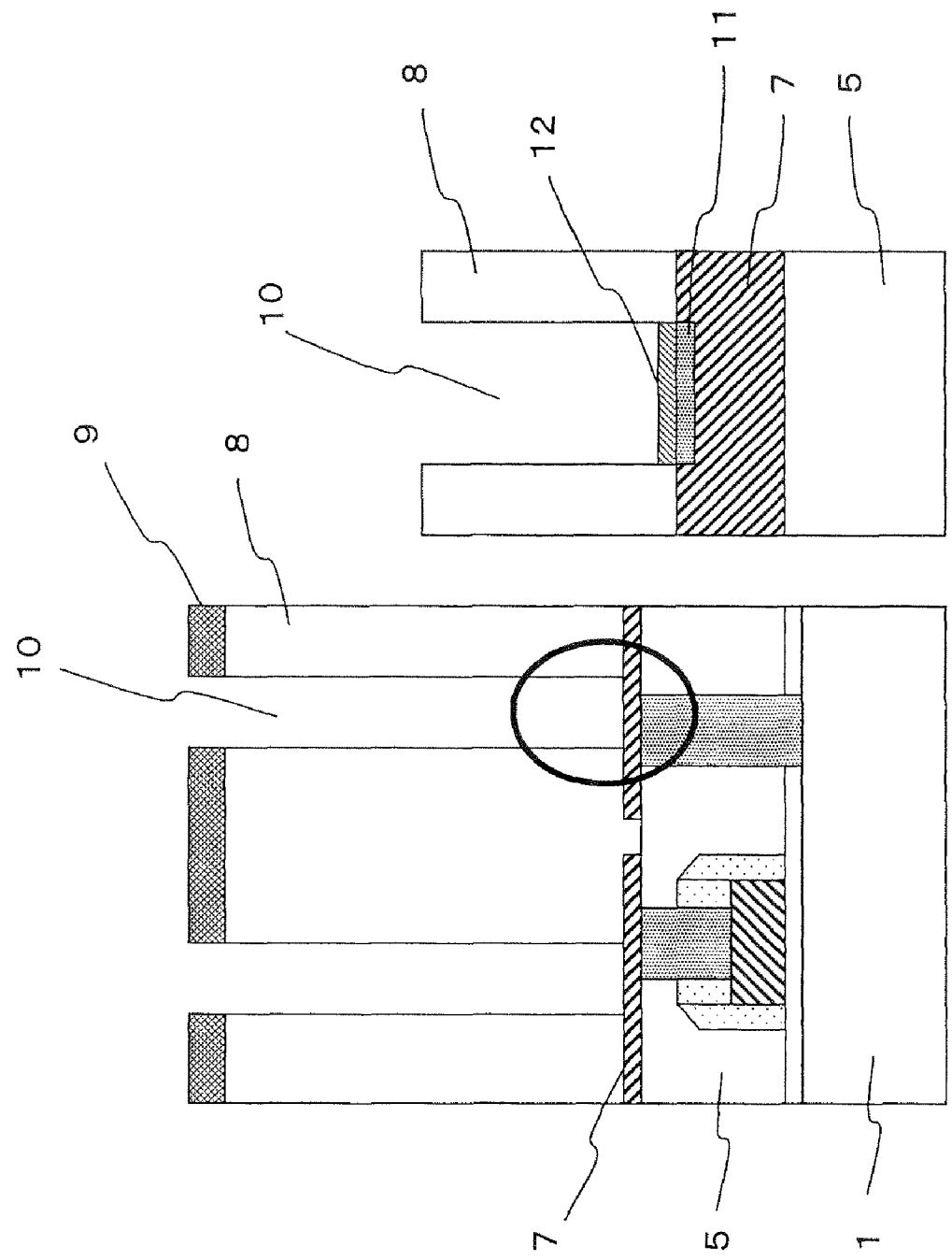

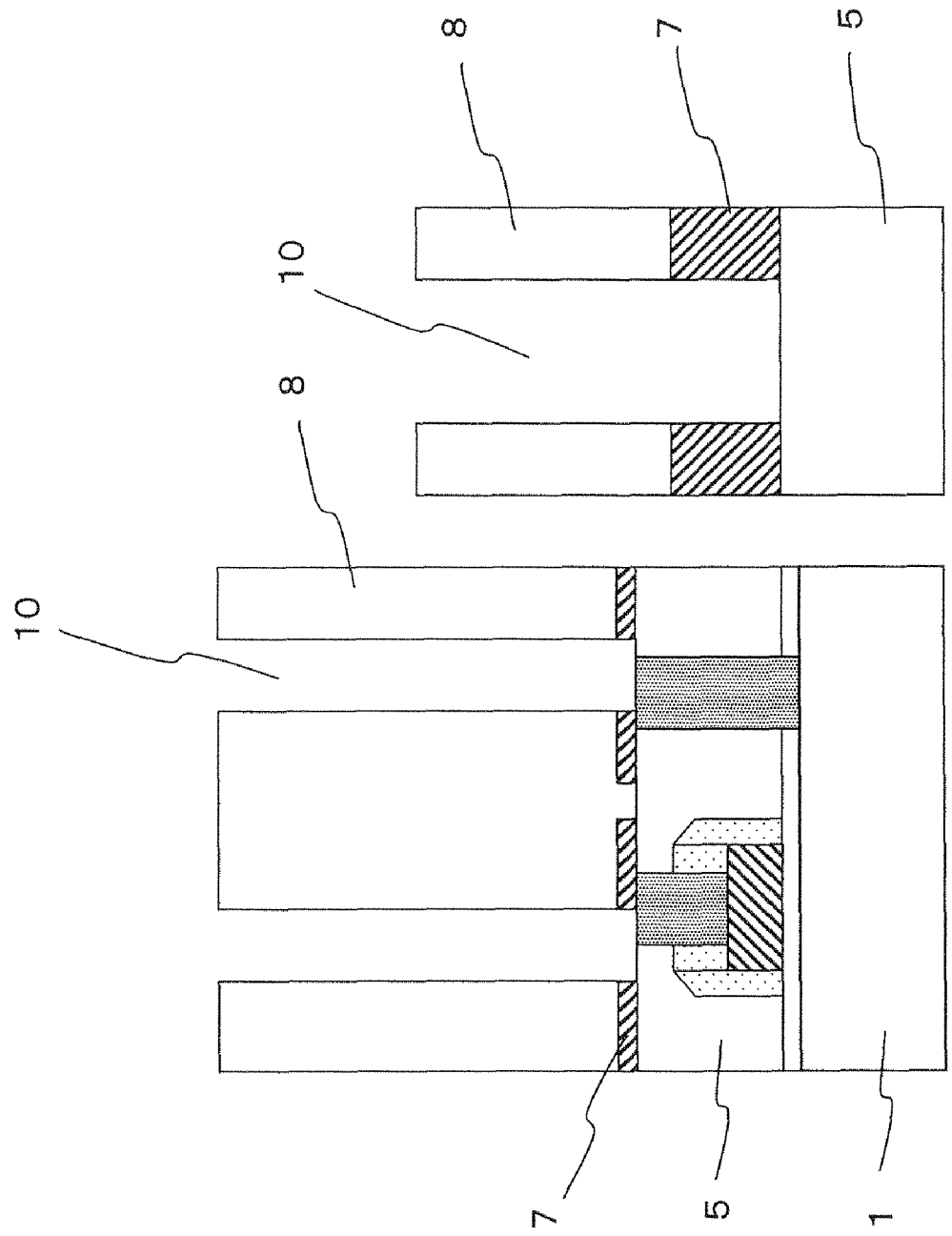
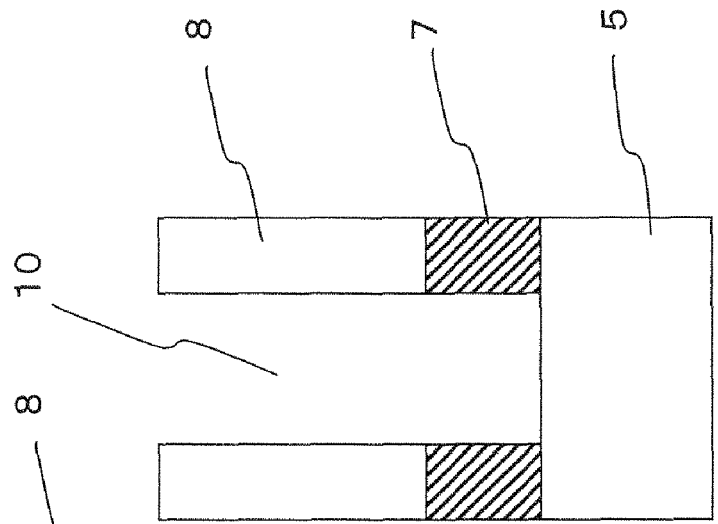

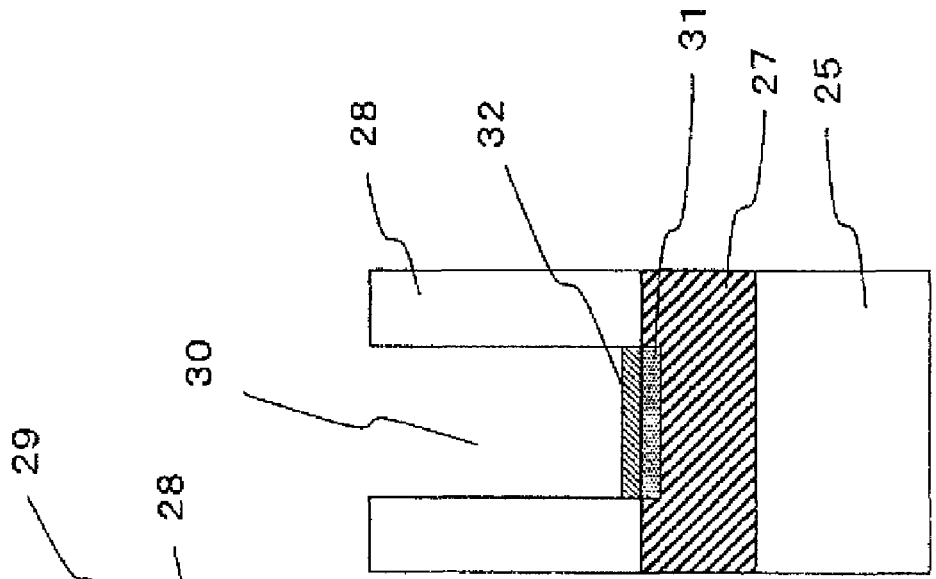
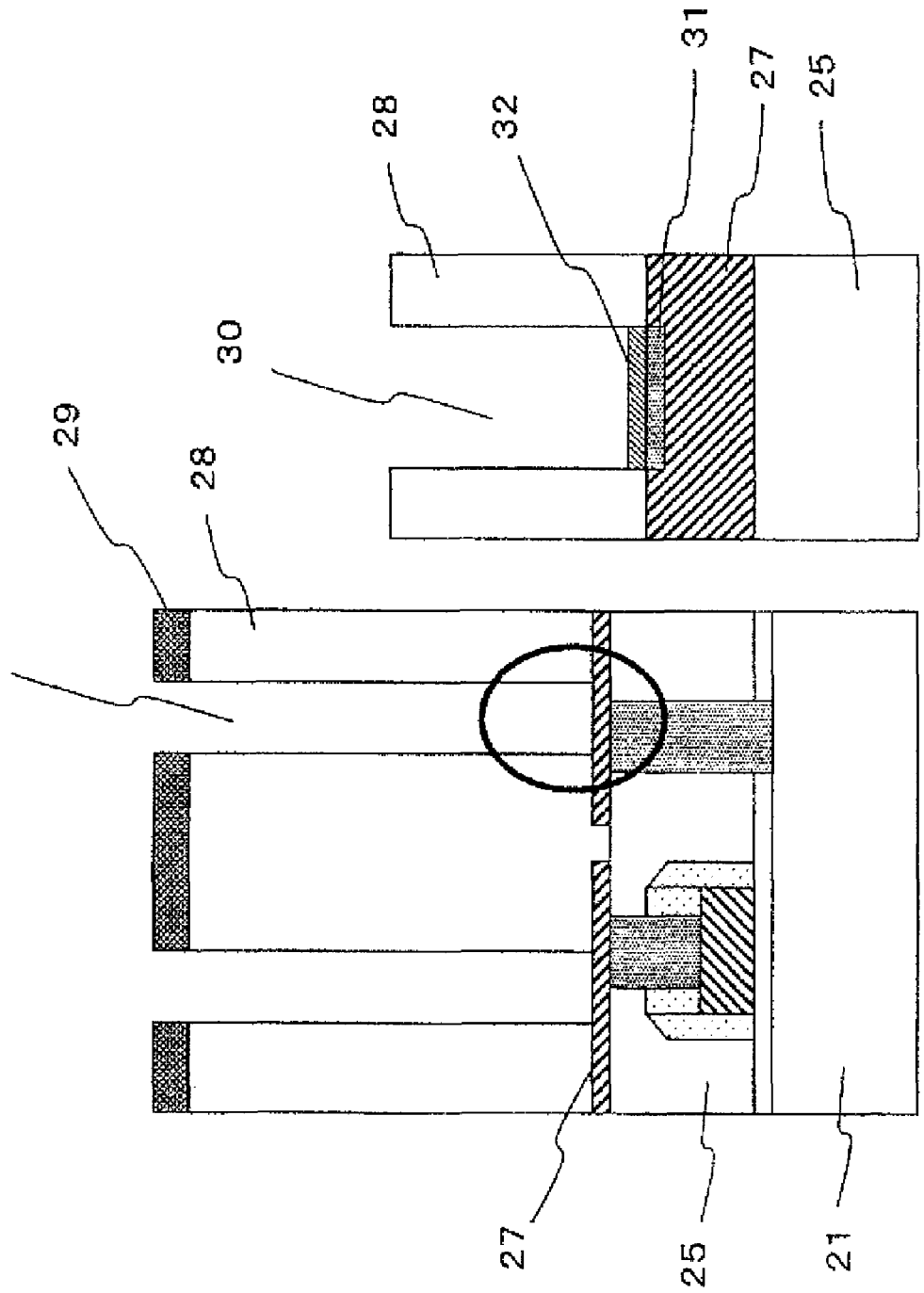

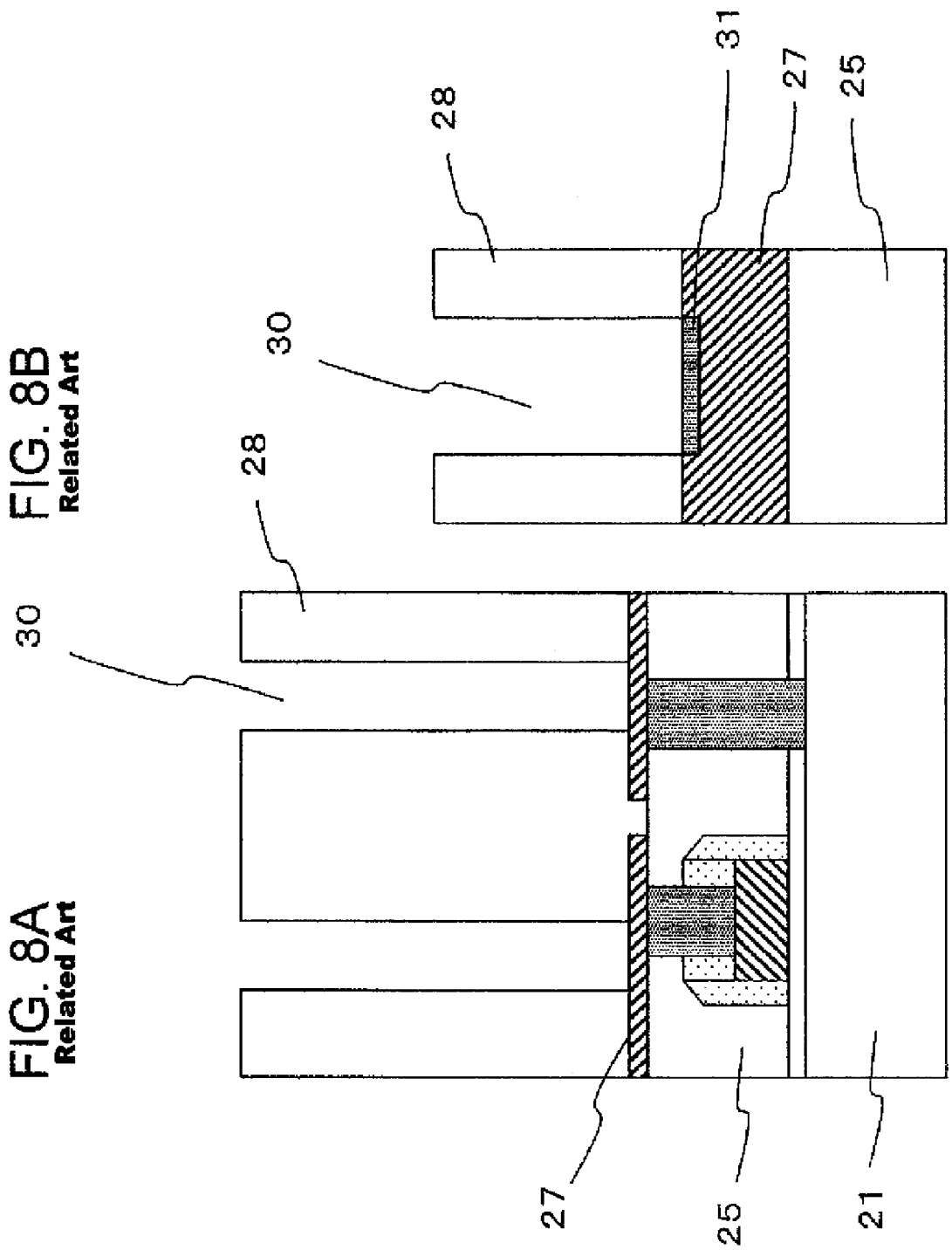

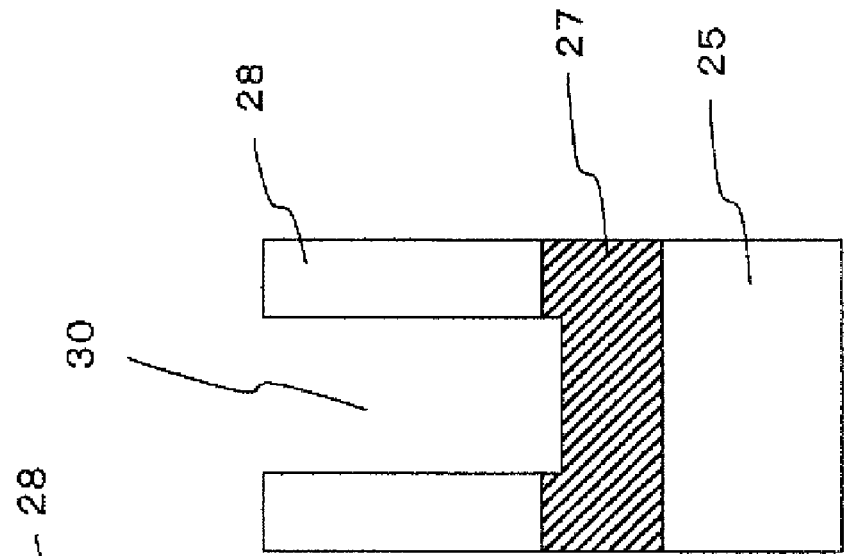
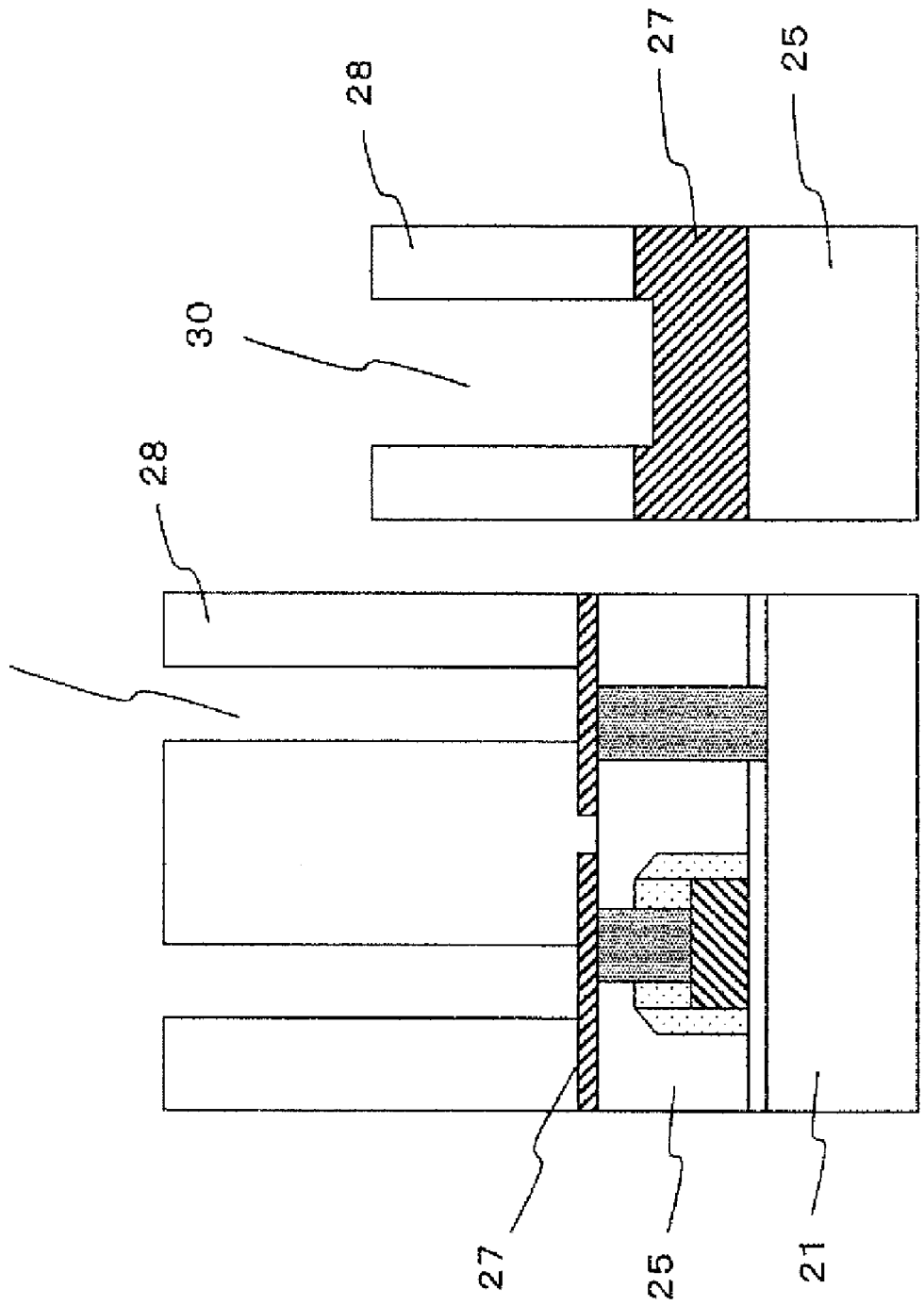

METHOD FOR MANUFACTURING SEMICONDUCTOR DEVICE HAVING VIA PLUG

BACKGROUND OF THE INVENTION

1. Field of the Invention

The present invention relates to a method for manufacturing a semiconductor device and, more particularly, to a method for forming a via plug for connecting a lower conductive layer and an upper conductive layer.

2. Description of Related Art

In the manufacture of a semiconductor device such as a DRAM, etching is generally performed under the condition that a lower-layer wiring is not removed even if overetching is done when forming a via hole by etching an interlayer insulating film on the lower-layer wiring (condition of a high selection ratio with respect to the lower-layer wiring), in a step of forming the via plug for connecting the lower-layer wiring and an upper-layer wiring, for example, in a step of forming the via plug in the structure after a lithography step shown in FIG. 6. In FIG. 6, reference numeral 21 denotes a semiconductor substrate, reference numeral 22 denotes a gate insulating film, reference numeral 23 denotes a gate electrode, reference numeral 24 denotes a silicon nitride film, reference numeral 25 denotes an interlayer insulating film, reference numeral 26 denotes a contact plug, reference numeral 27 denotes a lower-layer wiring, reference numeral 28 denotes an interlayer insulating film, and reference numeral 29 denotes a resist mask.

In addition, in the case of etching for forming a high-aspect-ratio via hole, etching needs to be performed under the condition of being able to secure resistance to a resist mask (condition of a high selection ratio with respect to the mask).

Under such a high selection ratio condition as described above, a deposition layer is easily formed within a hole, thus creating a condition in which etching is easily stopped by this deposition layer. If etching is performed under a high-ion energy condition in order to prevent this stop of etching, the deposition layer and a damage layer are formed in the bottom of the via hole.

Cross-section structures immediately after forming the via hole by performing etching under a high-selection ratio condition are shown in FIGS. 7A and 7B, wherein FIG. 7A shows a cross-section structure after a step following a step of forming the structure shown in FIG. 6 and FIG. 7B shows an enlarged cross-sectional view of an area near the circled portion of FIG. 7A (the contact plug 26 is omitted). As shown in FIG. 7B, a damage layer 31 and a deposition layer 32 are formed on the lower-layer wiring 27 in the bottom of a via hole 30. If the lower-layer wiring and the upper-layer wiring are connected by burying a conductive material in the hole and forming a via plug therein in the presence of such a damage layer and a deposition layer, the wirings do not conduct electricity or they go into a high-resistance state, thus significantly degrading the reliability of a finished semiconductor device.

Although the deposition layer is removed by a treatment of resist mask removal, the damage layer is not removed (FIGS. 8A and 8B). Accordingly, the damage layer is removed by means of light etching (FIGS. 9A and 9B). When this light etching is performed by means of dry etching, a gas containing oxygen and fluorine is used to remove the damage layer. In addition, the light etching is performed under a low-ion energy condition, in order to restrict the amount of abrasion in the lower-layer wiring as much as possible.

However, the amount of radicals and ions arriving at the bottom of the hole is small in the formation of a high-aspect-ratio via hole, thus leading to the insufficient removal of the damage layer. As a result, there probably occur a variation in contact resistance.

Japanese Patent Laid-Open No. 10-335450 (Patent Document 1) describes a method for suppressing contact resistance variations. This method will be described using FIGS. 10 to 12. In these figures, reference numeral 41 denotes a silicon substrate, reference numerals 42, 43 and 45 denote silicon dioxide films, reference numeral 44 denotes a lower-layer wiring (polysilicon layer), reference numeral 46 denotes a BPSG film, reference numeral 47 denotes a hole, reference numeral 48 denotes a barrier metal, reference numeral 49 denotes an electrical conductor, and reference numeral 50 denotes an upper-layer wiring.

In this method, the lower-layer wiring (polysilicon layer) 44 completely is etched within the hole, as shown in FIG. 11, with respect to the laminated structure shown in FIG. 10, when the hole 47 is formed in the formation of a plug for connecting the lower-layer wiring and the upper-layer wiring. Thus, the plug formed of the barrier metal 48 and the electrical conductor 49 is connected to the lower-layer wiring 44 at a side surface within the hole, as shown in FIG. 12. According to this method, an area of connection between the plug within the hole and the lower-layer wiring becomes smaller, when compared with a case in which etching for forming the hole is stopped at the upper portion of the lower-layer wiring 44. Thus, it is possible to reduce resistance variations, though contact resistance may increase. In addition, this method has a reduced number of steps as a method of hole formation Since the interlayer insulating film and the lower-layer wiring (polysilicon layer) are etched in the same step when forming the hole.

However, if the hole is formed by performing such etching as described above using a carbon (C)-containing resist mask, there is the possibility that C is introduced into the side surface of the lower-layer wiring during the etching. If C is present in the side surface within the hole where a contact is to be formed, there is the possibility of an altered layer being formed, thereby increasing contact resistance. The above-described problem does not occur if a contact hole is formed using a hard mask made of polysilicon or the like in place of the resist mask. As a result, however, the number of steps increases and so does the cost of manufacture.

SUMMARY

In one embodiment of the present invention, there is provided a method for manufacturing a semiconductor device, including:

forming a first conductive layer on a first insulating film;

forming a second insulating film so as to cover the first conductive layer;

forming a resist mask on the second insulating film;

forming a hole reaching the first conductive layer in the second insulating film by means of first dry etching using the resist mask;

removing the resist mask;

removing the first conductive layer exposed at the bottom of the hole by means of second dry etching, so that the hole reaches the first insulating film and the first conductive layer exposes at a side surface within the hole;

forming a conductive plug in contact with the first conductive layer exposed at the side surface within the hole by burying a conductive material in the hole; and forming a second conductive layer to be connected to the conductive plug on the second insulating film.

According to the present invention, it is possible to provide a method for manufacturing a semiconductor device whereby contact resistance variations can be reduced while holding down the cost of manufacture.

BRIEF DESCRIPTION OF THE DRAWINGS

Features and advantages of the present invention will be more apparent from the following description of certain preferred embodiments taken in conjunction with the accompanying drawings, in which:

FIGS. 2A and 2B are structural cross-sectional views after a step following a step of forming the structure shown in FIG. 1;

FIGS. 4A and 4B are structural cross-sectional views after a step following a step of forming the structure shown in FIGS. 3A and 3B;

FIGS. 7A and 7B are structural cross-sectional views after a step following a step of forming the structure shown in FIG. 6;

FIGS. 8A and 8B are structural cross-sectional views after a step following a step of forming the structure shown in FIGS. 7A and 7B;

FIGS. 9A and 9B are structural cross-sectional views after a step following a step of forming the structure shown in FIGS. 8A and 8B;

DETAILED DESCRIPTION OF THE PREFERRED EMBODIMENTS

Figure 1:
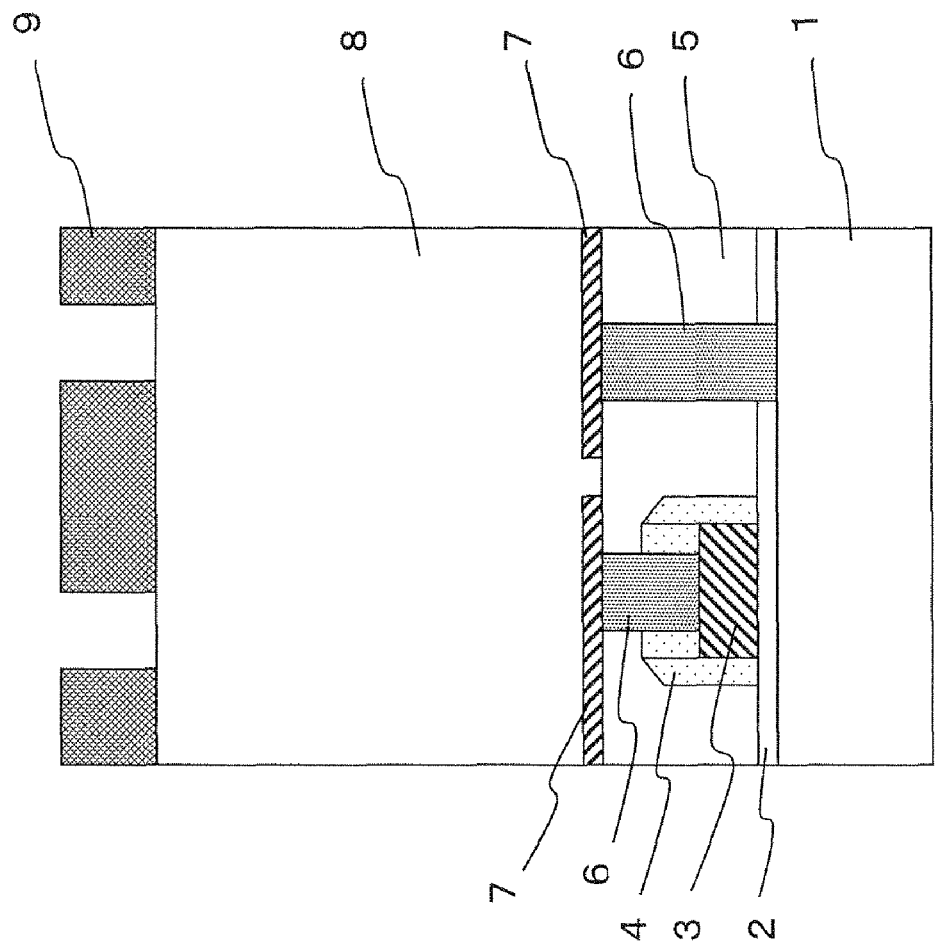
FIG. 1 is a structural cross-sectional view used to explain one exemplary embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

According to a first exemplary embodiment of the present invention, it is possible to form a via plug for connecting a lower conductive layer on a first insulating film and an upper conductive layer on a second insulating film covering the lower conductive layer, as described below.

First, the lower conductive layer is formed on the first insulating film, and then the second insulating film is formed so as to cover the lower conductive layer.

Next, a resist mask for forming a hole corresponding to a targeted via plug is formed on the second insulating film using a usual lithography technique. This resist mask can be formed using a carbon-containing resist such as an organic resist.

A hole reaching the lower conductive layer is formed through the second insulating film by means of first dry etching using the resist mask.

Next, the resist mask is removed.

Next, the lower conductive layer exposed at a bottom within the hole is removed by means of second dry etching. Consequently, this hole reaches the first insulating film, and the lower conductive layer is exposed at a side surface within the hole. Since the damage layer produced by first etching is removed at that time, it is possible to prevent the occurrence of variation in contact resistance due to a damage layer.

Next, a conductive plug in contact with the lower conductive layer exposed at a side surface within the hole is formed by burying a conductive material in the hole. After that, the upper conductive layer to be connected to the conductive plug is formed on the second insulating film.

In the above-described manufacturing process, the removal of the resist mask can be achieved by dry etching. In that case, it is possible to consecutively perform the first dry etching, the dry etching for removing the resist mask, and the second dry etching within the etching chamber of the same dry etching apparatus. Consequently, it is possible to reduce contact resistance variations without increasing the number of steps, i.e., while suppressing an increase in the cost of manufacture. As the dry etching apparatus, it is possible to suitably use a reactive ion etching (RIE) apparatus.

The first dry etching is preferably performed under the condition that the etching selection ratio of an insulating film, such as an oxide film, is 50 or higher with respect to the lower conductive layer. At that time, it is possible to favorably perform such etching by using a carbon-rich, fluorocarbon-containing gas such as $C_4F_8$, $C_5F_8$ or $C_4F_6$. This etching gas can be made to contain oxygen, a rare gas or the like, as necessary.

The dry etching for removing the resist mask can be performed by using an $O_2$-containing gas. At this time, it is possible to simultaneously remove a C-containing deposition layer formed on the lower conductive layer at the bottom of the hole. This etching gas can be made to contain a rare gas or the like, as necessary.

The second dry etching can selectively etch away the lower conductive layer exposed at the bottom of the hole by using a gas containing a fluorine-rich gas such as $CF_4$, $CH_3F$, $CH_2F_2$ or $CHF_3$. This etching gas can be made to contain oxygen, a rare gas, a halogen gas or the like, as necessary.

Hereinafter, the first exemplary embodiment of the present invention will be described in more detail using FIGS. 1 to 5B.

First, the structure shown in FIG. 1 is formed on a semiconductor substrate 1 according to a usual method. This structure can be obtained by carrying out: a step of preparing a semiconductor substrate 1 having an element-isolating region (not shown); an ion implantation step for channel formation; a step of forming a gate insulating film 2; a step of forming a gate electrode 3; a step of forming a cap and sidewall insulating film (silicon nitride film) 4; an ion implantation step for source/drain (not shown) formation; a step of forming a first interlayer insulating film 5; a step of planarization; a step of forming first plugs 6 reaching the substrate and the gate electrode; a step of forming a first wiring (lower-layer wiring) 7 to be connected to the first plug; a step of forming a second interlayer insulating film 8; and a step of forming a resist mask 9 for forming a second plug to be connected to the first wiring 7 in the second interlayer insulating film. The first wiring 7 can be formed of, for example, tungsten (W) and the film thickness of the wiring can be set to 50 nm. The thickness of the second interlayer insulating film 8 can be set to 3.0 μm. The resist mask 9 is formed of an organic resist material and the aperture diameter of the mask can be set to 150 nm. The first plugs 6 can be formed of impurity-containing polysilicon or of W.

Next, as shown in FIGS. 2A and 2B, a hole 10 reaching the first wiring 7 is formed by performing etching using the resist mask 9. FIG. 2B shows an enlarged cross-sectional view of an area near the circled portion of FIG. 2A (plug 6 is omitted).

In one example of the present exemplary embodiment, there was used a two-frequency RIE apparatus, as an etching apparatus, in which RF power was respectively applied to an upper electrode and a lower electrode on which a wafer was mounted. For etching gases, $C_4F_6$, $O_2$ and Ar were used, the typical gas flow rates of which were $C_4F_6$: 40 sccm, $O_2$: 50 sccm and Ar: 800 sccm and the pressure of which was 25 mTorr (3.33 Pa). The RF power applied to the upper electrode was 3000 W and the RF power applied to the lower electrode was 3600 W. Under this condition, etching for a period of time corresponding to an overetch of 20% was performed for the thickness of the second interlayer insulating film 8. The overetch time was determined from the thickness and the thickness variation of the second interlayer insulating film 8 and from the etching rate and the etching rate variation of the insulating film in this etching. In the present example, an overetch of 20% proved suitable.

In the above-described etching for forming the hole, the etching selection ratio with respect to the resist mask 9 is preferably 5 or higher, and the etching selection ratio with respect to the first wiring (W) 7 is preferably 50 or higher. The first wiring 7 in the bottom of the hole 10 was etched approximately 12 nm by etching under such conditions as described above, and a damage layer 11 due to ion bombardment during the etching and a C-containing deposition layer 12 were formed on this first wiring 7 (FIG. 2B).

Figures 3A, 3B:
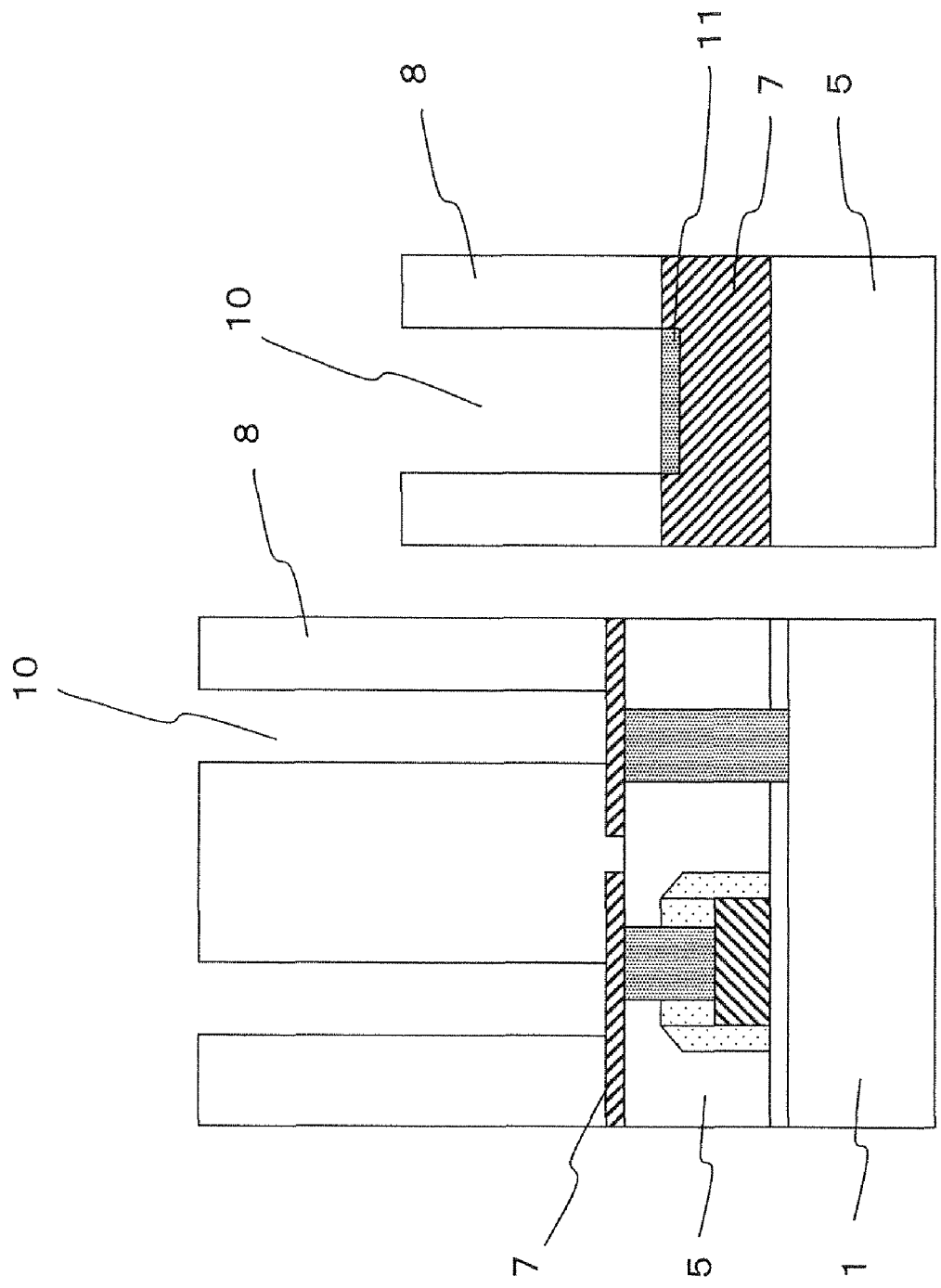
FIGS. 3A and 3B are structural cross-sectional views after a step following a step of forming the structure shown in FIGS. 2A and 2B.

Next, as shown in FIGS. 3A and 3B, the resist mask 9 was removed by performing etching within the chamber of the same RIE apparatus. For etching gases, $O_2$ and Ar were used, the typical gas flow rates of which were $O_2$: 30 sccm and Ar: 500 sccm and the pressure of which was 25 mTorr (3.33 Pa). The RF power applied to the upper electrode was 3000 W and the RF power applied to the lower electrode was 500 W. By applying 90 seconds of treatment under this condition, the resist mask was removed along with the deposition layer 12 on the first wiring 7.

Next, as shown in FIGS. 4A and 4B, the first wiring 7 in the bottom of the hole 10 was completely removed by etching. For etching gases, $CF_4$, $O_2$, $CL_2$ and Ar were used, the typical flow rates of which were $CF_4$: 80 sccm, $O_2$: sccm, $CL_2$: 20 sccm, and Ar: 500 sccm and the pressure of which was 25 mTorr (3.33 Pa). The RF power applied to the upper electrode was 3000 W and the RF power applied to the lower electrode was 1000 W. By applying 30 seconds of treatment under this condition, the damage layer 11 was removed, and the first wiring 7 in the bottom of the hole 10 was completely removed as well. As a result, the side surface of the first wiring was exposed at a side surface within the hole in the vicinity of the bottom of the hole. Since the thickness of the first wiring 7 was small, the first wiring 7 could be easily removed while suppressing the amount of overetch even if the etching selection ratio was not high. In addition, it was possible to prevent damage to the exposed side surface of the first wiring since etching could be performed with relatively low ion energy.

Figure 5B:
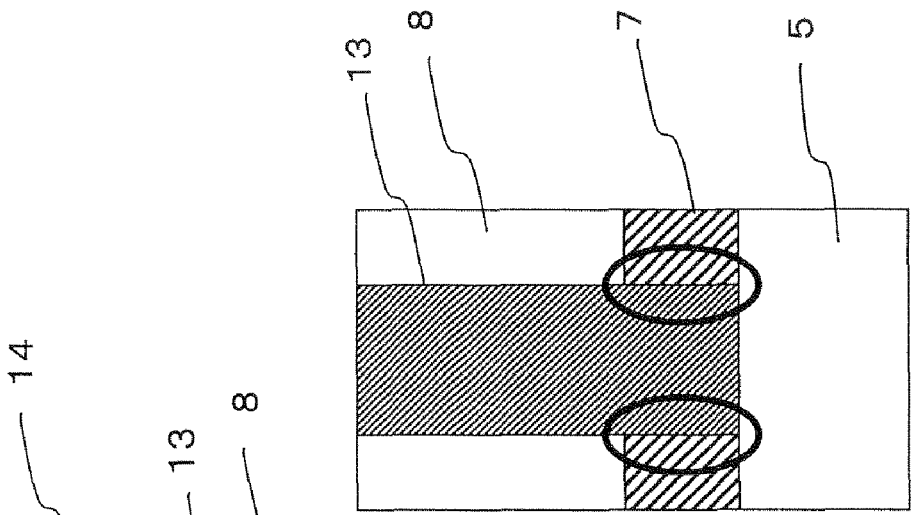
FIGS. 5A and 5B are structural cross-sectional views after a step following a step of forming the structure shown in FIGS. 4A and 4B.
Figure 5A:
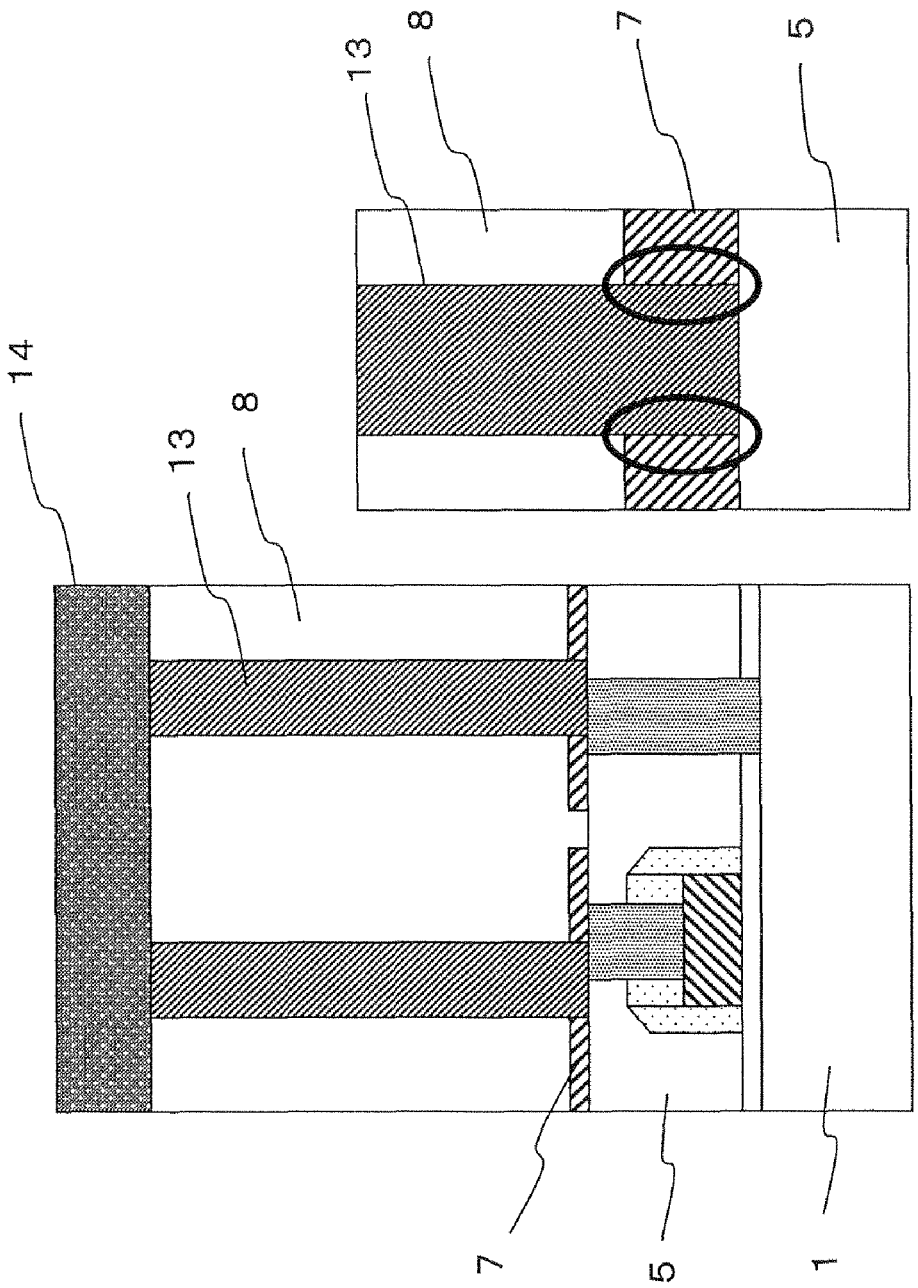
Figure 6:
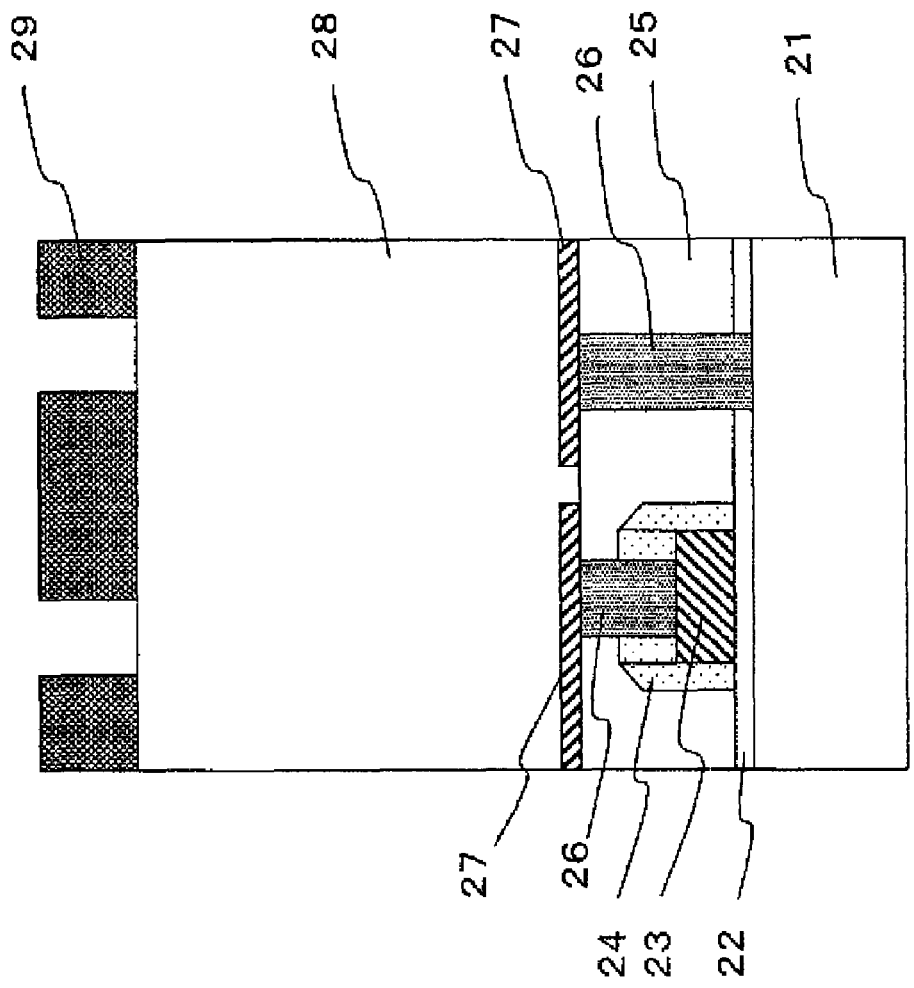
FIG. 6 is a structural cross-sectional view used to explain a problem with a method for manufacturing a semiconductor device using a related art.
Figure 10:
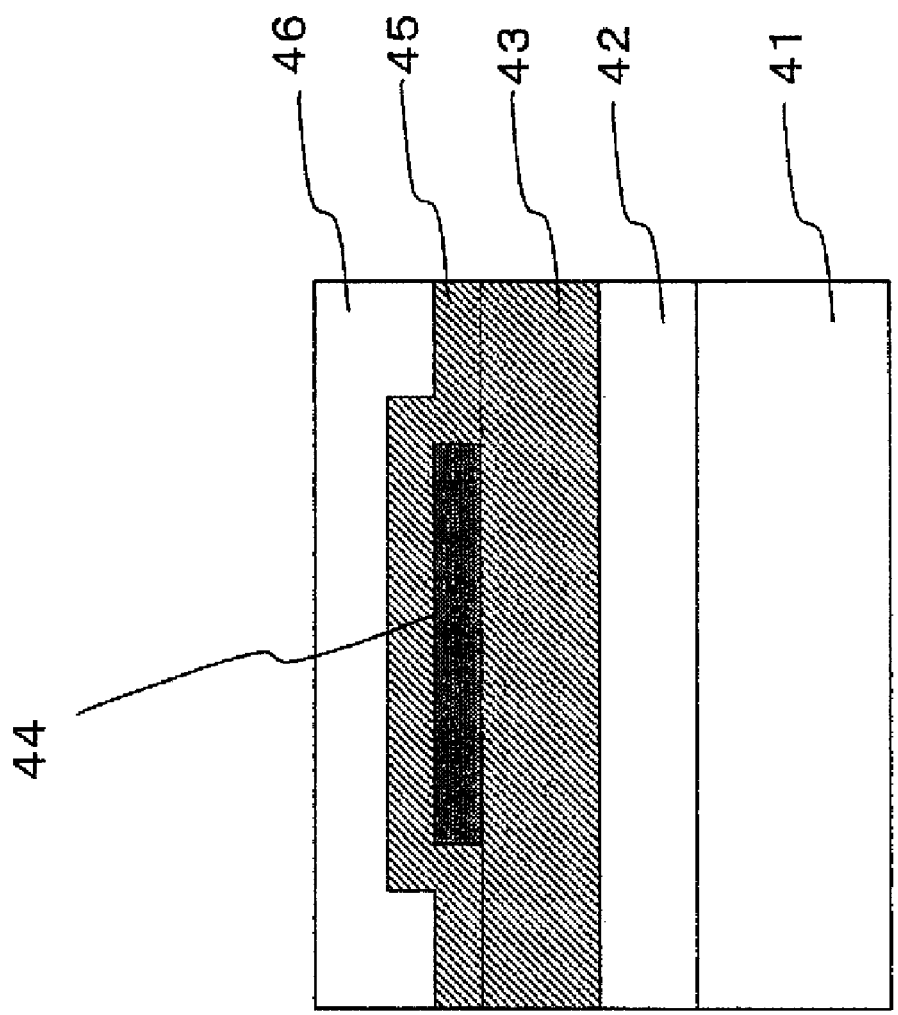
FIG. 10 is a structural cross-sectional view used to explain a conventional method for manufacturing a semiconductor device.
Figure 11:
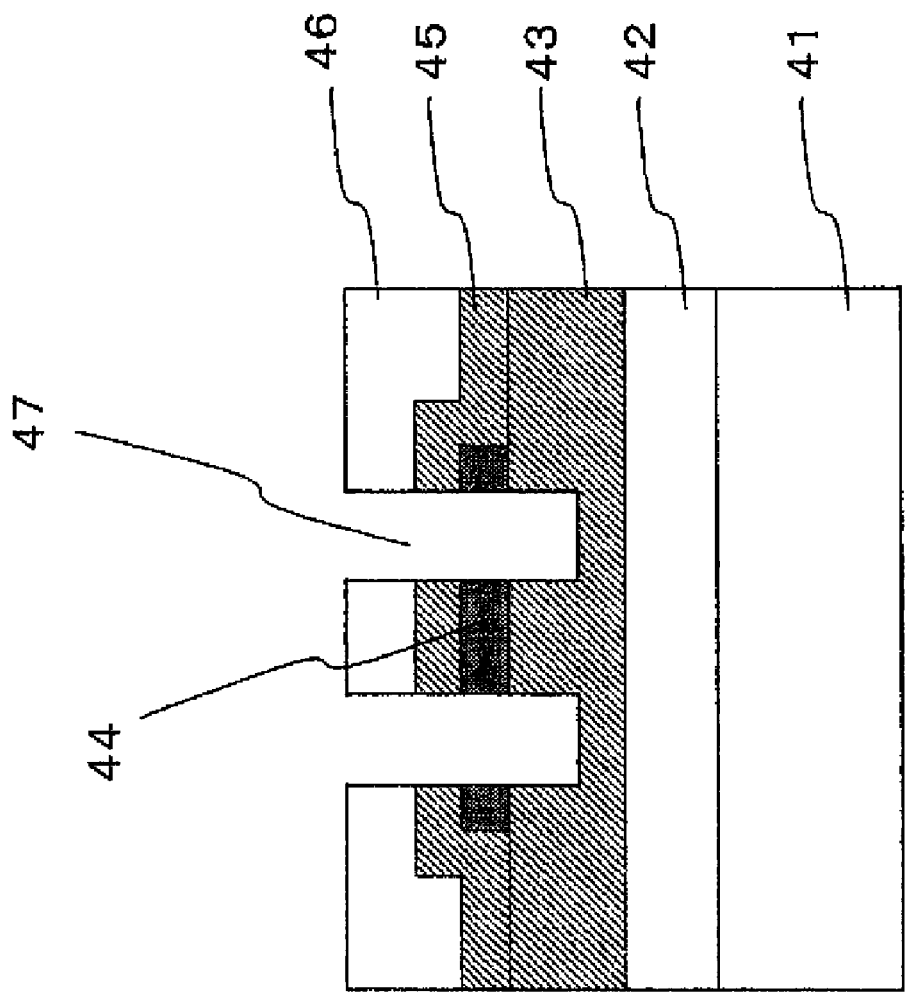
FIG. 11 is a structural cross-sectional view after a step following a step of forming the structure shown in FIG. 10.
Figure 12:
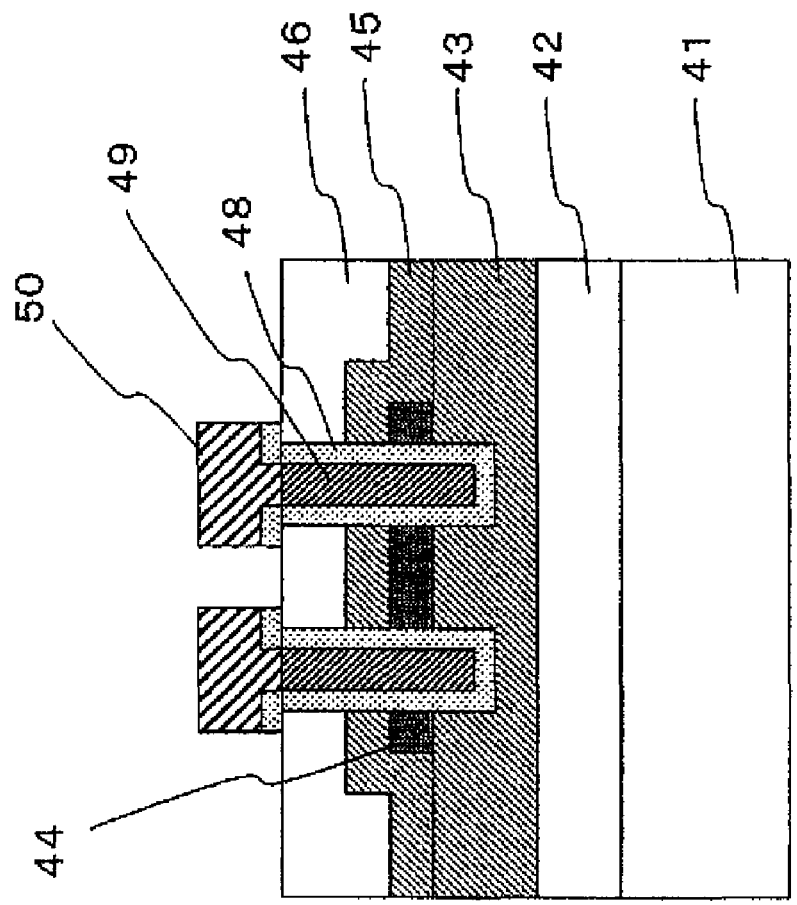
FIG. 12 is a structural cross-sectional view after a step following a step of forming the structure shown in FIG. 11.

Next, as shown in FIGS. 5A and 5B, a conductive film was formed so as to fill the hole 10, the conductive film external to the hole was removed using a usual method, and a plug 13 was formed within the hole. After that, a conductive film for a second wiring was formed, and the conductive film was patterned using a usual lithography technique and a usual dry etching technique to form the second wiring (upper-layer wiring) 14. As a result, there was obtained a structure in which the bottom side surface of the plug formed within the hole and the side surface of the first wiring were connected to each other (see the circled portions of FIG. 5B).

As the result of removing the first wiring 7 in the bottom of the hole along with the damage layer 11, as described above, after the removal of the resist mask 9, there existed no C attributable to the resist in an exposed part of the first wiring within the hole (connection part between the plug and the first wiring). Thus, it is possible to reduce resistance variations due to the presence of this C.

In addition, since it is possible to consecutively perform etching for forming the hole, etching for removing the resist, and etching for removing the first wiring within the same chamber, it is possible to hold down the cost of manufacture.

In contrast to the above-described method of the example of the first embodiment, there is provided a method for completely etching the lower-layer wiring (first wiring) by etching for forming the hole, and then removing the resist mask. However, it is difficult to control the etching amount of the insulating film under the lower-layer wiring if an interlayer insulating film between the lower-layer wiring (first wiring) and the upper-layer wiring (second wiring) is thick. If there is another wiring layer under the lower-layer wiring, the hole will reach as far as to the wiring layer, thereby probably causing a failure. In addition, C attributable to the resist mask is introduced into the lower-layer wiring exposed at a side surface within the hole during etching, thereby probably causing a variation in contact resistance. Furthermore, a damage layer on the side surface of the lower-layer wiring within the hole can not be sufficiently removed in a case of forming a high-aspect-ratio hole. As a result, there probably occurs a variation in the contact resistance. According to the present invention, it is possible to favorably form a plug for connecting the upper-layer wiring and the lower-layer wiring without causing such problems as described above.

It is apparent that the present invention is not limited to the above embodiments, but may be modified and changed without departing from the scope and spirit of the invention.

What is claimed is:

1. A method for manufacturing a semiconductor device, comprising:
   forming a first conductive layer on a first insulating film;
   forming a second insulating film so as to cover said first conductive layer;
   forming a resist mask on said second insulating film;
   forming a hole reaching said first conductive layer in said second insulating film by means of first dry etching using said resist mask;
   removing said resist mask;
   removing said first conductive layer exposed at the bottom of said hole by means of second dry etching, so that said hole reaches said first insulating film and said first conductive layer exposes at a side surface within said hole;
   forming a conductive plug in contact with said first conductive layer exposed at the side surface within said hole by burying a conductive material in said hole; and
   forming a second conductive layer to be connected to said conductive plug on said second insulating film.

2. The method for manufacturing a semiconductor device according to claim 1, wherein the removal of said resist mask is achieved by dry etching, and said first dry etching, said dry etching for removing said resist mask, and said second dry etching are performed within the same dry etching apparatus.

3. The method for manufacturing a semiconductor device according to claim 2, wherein said dry etching apparatus is a reactive ion etching apparatus.

4. The method for manufacturing a semiconductor device according to claim 1, wherein said resist mask is formed of a carbon-containing resist.

5. The method for manufacturing a semiconductor device according to claim 1, wherein said resist mask is formed of an organic resist.

6. The method for manufacturing a semiconductor device according to claim 1, wherein a fluorocarbon-containing etching gas selected from the group consisting of $C_4F_8$, $C_5F_8$ and $C_4F_6$ is used in said first dry etching, an oxygen-containing gas is used in said dry etching for removing said resist mask, and a fluorocarbon-containing etching gas selected from the group consisting of $CF_4$, $CH_3F$, $CH_2F_2$ and $CHF_3$ is used in said second dry etching.

* * * * *